(12) United States Patent  (10) Patent No.: US 6,533,391 B1
Pan  (45) Date of Patent: Mar. 18, 2003

(54) SELF-ALIGNED MODULES FOR A PAGE WIDE PRINTHEAD

(75) Inventor: Alfred I-Tsung Pan, Sunnyvale, CA (US)

(73) Assignee: Hewlett-Packard Development Company, LLP, Houston, TX (US)

( * ) Notice: Subject to any disclaimer, the term of this patent is extended or adjusted under 35 U.S.C. 154(b) by 214 days.

(21) Appl. No.: 09/695,627

(22) Filed: Oct. 24, 2000

(51) Int. Cl.$^7$ ............................................. H01L 23/48
(52) U.S. Cl. ........................................ 347/42; 257/778
(58) Field of Search ..................... 347/42, 49; 156/285; 257/778, 443; 29/840; 356/401; 204/600; 439/632

(56) References Cited

U.S. PATENT DOCUMENTS

| | | | | |
|---|---|---|---|---|
| 4,659,226 A | * | 4/1987 | Elabd .......................... | 356/401 |
| 5,283,446 A | * | 2/1994 | Tanisawa ..................... | 257/433 |
| 5,406,701 A | * | 4/1995 | Pepe et al. ................... | 29/840 |
| 5,877,560 A | * | 3/1999 | Wen et al. .................... | 257/778 |
| 6,185,138 B1 | * | 2/2001 | Bodo et al. ................... | 257/778 |
| 6,319,065 B1 | * | 11/2001 | Farnworth et al. ........... | 439/632 |
| 6,322,683 B1 | * | 11/2001 | Wolk et al. ................... | 204/600 |

* cited by examiner

Primary Examiner—Anh T. N. Vo

(74) Attorney, Agent, or Firm—Trueman H. Denny, III

(57) ABSTRACT

A system for precision self-alignment of multiple modules on an alignment substrate is disclosed. An alignment substrate includes a plurality of self-alignment features having a first profile formed in along a mounting surface thereof. A plurality of module substrates are mounted on the alignment substrate. Each module substrate includes an alignment key having a second profile formed along a base surface of the module substrate. The second profile of the alignment key complements the first profile of the self-alignment features. The module substrates are mounted on the alignment substrate by inserting their respective alignment keys into the self-alignment features so the alignment keys and the self-alignment features are connected in mating engagement with each other. As a result, the module substrates are positioned in near perfect self-alignment with each other with substantially no skew. The first profile and the second profile can be formed along a first crystalline plane and a second crystalline plane of the mounting and base surfaces respectively. The first and second crystalline planes can be identical to each other and the first and second profiles can be formed by etching the mounting and base surfaces using a wet etch such as an anisotropic etch. The alignment and module substrates can be made from a single crystalline material such as silicon. By using silicon, the module substrates can be positioned in near perfect self-alignment with each other with substantially no skew in a X-Y plane, a X-Z plane, and a Y-Z plane of a Cartesian coordinate system and the alignment substrate and the module substrates will have identical coefficients of thermal expansion.

20 Claims, 9 Drawing Sheets

SELF-ALIGNED MODULES FOR A PAGE WIDE PRINTHEAD

FIELD OF THE INVENTION

The present invention relates generally to multiple modules that are mounted on an alignment substrate in near perfect self-alignment with one another and with substantially no skew. More specifically, the present invention relates to an alignment substrate having a plurality of self-alignment features and a plurality of module substrates having an alignment key that connects with the self-alignment features in mating engagement so that the modules are mounted to the alignment substrate in near perfect self-alignment with one another with substantially no skew.

BACKGROUND ART

Thermal inkjet print cartridges operate by rapidly heating a minute volume of ink to cause the ink to vaporize and be ejected through an orifice. The ejected ink forms an ink droplet that impacts on a medium to be printed on, such as a sheet of paper. Typically, an inkjet cartridge (printhead) has a plurality of orifices arranged in an array. By properly sequencing the ejection of ink droplets from each orifice, characters or images can be printed on the medium as the ink cartridge is moved across the medium.

The minute volume of ink is contained in a vaporization chamber that includes a thin film resistor that is in contact with the ink. An electrical current from an external power supply is passed through the resistor causing the resistor to heat up. The heat from the resistor causes the ink to become superheated so that the ink explosively vaporizes and is ejected from the vaporization chamber and through the orifice to print a single ink droplet on the medium. In a thermal inkjet printer incorporating the printhead, the thin film resistors are selectively energized while a transport mechanism moves the printhead in a path across the medium to be printed on. Additionally, the medium is incrementally moved perpendicular to the path of the printhead to enable printing on almost the entire surface of the medium.

Although state-of-the-art thermal inkjet printers are fast, quite, and can produce high quality (>600 dpi) images, there are advantages to reducing or eliminating the mechanical complexity of the printer. For example, it is desirable to eliminate the noise and mechanical complexity of the printhead transport. To that end, it is known to those skilled in the printer art to reduce the mechanical complexity of a printer by mounting separate printheads in a side-by-side arrangement to form an array of discrete printheads that extend across the entire width of the medium to be printed. Selected printing elements across the array are energized to print a line of ink droplets across the medium. After each line is printed, the medium is incrementally advanced in a direction perpendicular to the array, and the line printing process is then repeated until an entire image has been printed on the medium. Consequently, the array remains stationary during printing thereby eliminating the noise, vibration, and mechanical complexity of the transport mechanism.

One disadvantage of the side-by-side arrangement is the difficulty in precisely aligning the printheads with one another. As the resolution of ink jet printers exceeds 1200 dpi (dots per inch), the alignment of the orifices of the discrete printheads across an array that can span eight or more inches requires extremely precise alignment to achieve satisfactory spacing between ejected ink droplets on the medium. Moreover, the precise alignment between the printheads must be maintained over a wide range of operating conditions, environmental conditions, and over the lifetime of the printer. Additionally, precise alignment may not be possible if one or more of the discrete printheads is manufactured with an array of orifices that are misaligned with respect to the printhead cartridge. For color printing, multiple printbars may be used for printing color images. There is one printbar for each color to be printed (typically 3 to 4 colors). Each printbar will include multiple discrete printheads with each printhead printing the same color of ink. It is critical that the printheads on the printbar be in alignment with one another, but it is also critical for the printbars to be aligned with one another. Self-alignment between the printbars is especially critical for page-wide printbars that can span 8 or more inches in width.

Prior attempts to mount multiple printheads in precise alignment with one another have included the use of a ceramic substrate as a carriers for a plurality of printheads. The printheads are fixedly mounted to the substrate using an adhesive or the like. A precision machine is required to place each printhead on the substrate, to hold each printhead in position on the substrate, and to align the substrates with one another. The required machinery is expensive and to the process for aligning the printheads on the substrate is time consuming and is subject to low process yields. Therefore, the resulting product is expensive and can not be manufactured in high volumes.

Other factors that contribute to misalignment amongst the printheads once they are mounted include a thermal mismatch between the printheads and the substrate they are mounted on. For instance environmental conditions such a temperature and humidity can cause the printheads and the substrate to thermally expand or thermally contract at different rates due to the substrate and the modules having different coefficients of thermal expansion. Furthermore, as the printheads are energized to print ink droplets, the printheads heat up. Consequently, the printheads expand at a different rate than the substrate, resulting is misalignment, thermal stress cracks, or even failure of the printhead due to thermal stress.

Accordingly, there exists a need to use standard microelectronic equipment and process steps to manufacture a substrate and multiple modules that can be mounted on the substrate with near perfect self-alignment between the modules and with substantially no skew between the modules. Moreover, there is a need for a substrate and modules that have compatible coefficients of thermal expansion so that environmental conditions do not compromise the near perfect self-alignment between the mounted modules. Finally, there is a need to mount multiple printbars in near perfect self-alignment with one another.

SUMMARY OF THE INVENTION

Broadly, the present invention is embodied in a system for precision self-alignment of multiple modules. The system includes at least one alignment substrate including at least one mounting surface and a plurality of self-alignment features having a first profile formed along the mounting surface and a plurality of module substrates, each module substrate including a base surface and an alignment key having a second profile formed along the base surface. The second profile of the alignment key complements the first profile of the self-alignment features. The module substrates are connected with the alignment substrate by inserting their respective alignment keys into the self-alignment features so that the alignment keys and the self-alignment features are connected in mating engagement with each other. As a result, the module substrates are positioned in near perfect self-alignment with one another with substantially no skew.

In one embodiment of the present invention, the first and second profiles are formed by etching the mounting and base surfaces along identical crystalline planes. The alignment substrate and the module substrates can be made from a single crystal material and a wet etch process can be used to form the first and second profiles of the self-alignment features and the alignment keys respectively.

Conventional microelectronic processing equipment and processing steps can be used to pattern and etch the self-alignment features and the alignment keys so that those features can be formed with photolithographic precision. As a result, the module substrates can be mounted to the alignment substrate with a precision that is inherent to the microelectronic process. Therefore, the need for expensive custom machinery is eliminated. Moreover, the processing steps involved in making the system according to the present invention are well understood by those skilled in the semiconductor and microelectronics art. Therefore, problems with low yield and high cost are addressed by the system of the present invention.

In another embodiment of the present invention, the alignment substrate and the module substrates are made from single crystal silicon. The use of the same material for the alignment and module substrates results in identical coefficients of thermal expansion. Accordingly, the aforementioned problems associated with thermal stress, thermal mismatch, and dissimilar coefficients of thermal expansion are addressed by the system of the present invention.

In yet another embodiment of the present invention, the alignment substrate is formed using a precision machining process to form self-alignment features with a first profile that complements the second profile of the alignment keys.

Other aspects and advantages of the present invention will become apparent from the following detailed description, taken in conjunction with the accompanying drawings, illustrating by way of example the principles of the present invention.

DETAILED DESCRIPTION

Figure 1:
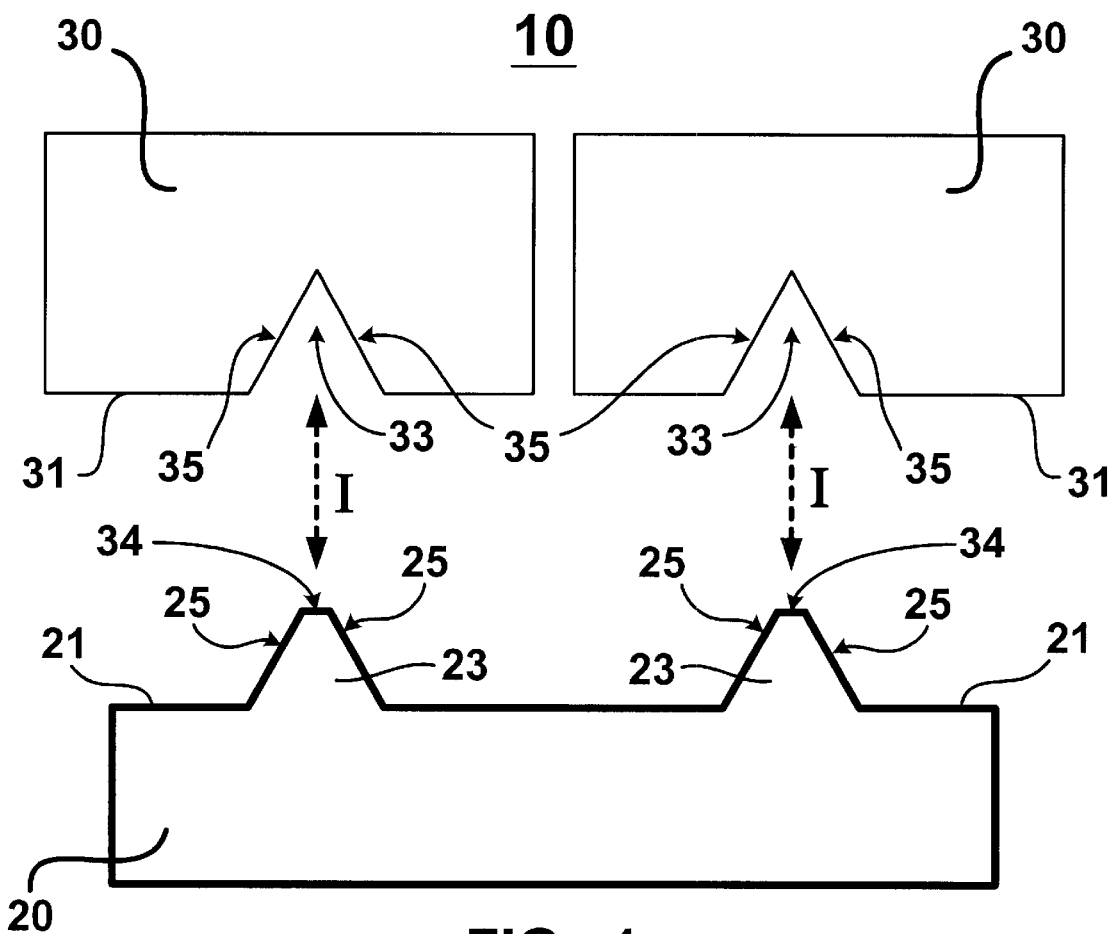
FIG. 1 is a cross-sectional view of an alignment substrate with mesa self-alignment features and module substrates with self-terminating pit alignment keys prior to being connected according to the present invention.

In the following detailed description and in the several figures of the drawings, like elements are identified with like reference numerals.

As shown in the drawings for purpose of illustration, the present invention is embodied in a system for precision self-alignment of multiple modules. The system includes at least one alignment substrate and a plurality of module substrates. The alignment substrate includes at least one mounting surface and a plurality of self-alignment features having a first profile formed along the mounting surface. Each of the module substrates includes a base surface with an alignment key having a second profile formed along the base surface. The second profile of the alignment key complements the first profile of the self-alignment features. The module substrates are connected with the alignment substrate by inserting their respective alignment keys into the self-alignment features so that the alignment keys and the self-alignment features are connected in mating engagement with each other. Resulting are module substrates that are positioned in near perfect self-alignment with one another with substantially no skew. The first profile of the self-alignment features can have a mesa shape that extends outward of the mounting surface and the second profile of the alignment key can have a self-terminating pit shape that extends inward of the base surface. Alternatively, the first profile can have the self-terminating pit shape and the second profile can have the mesa shape. In either case, the shapes of the mesa and self-terminating pit compliment each other.

The alignment keys along with the self-alignment features operatively orient the module substrates such that they are in near perfect self-alignment with one another. The use of materials that have identical coefficients of thermal expansion significantly reduces or eliminates thermal stress related displacement among the module substrates so that there is substantially no skew between the module substrates. Additionally, the alignment keys along with the self-alignment features provide for a simplified method for mounting the module substrates to the alignment substrate that eliminates the need for expensive machinery to position and hold mounted modules in a fixed position until an adhesive or the like has cured.

Reference is now made to FIG. 1, in which is illustrated a system 10 for precision alignment of multiple modules. The system 10 includes at least one alignment substrate 20 that includes at least one mounting surface 21 and a plurality of self-alignment features 23 that have a first profile 25 formed along a first crystalline plane (not shown) of the mounting surface 21. The system 10 also includes a plurality of module substrates 30 (two are shown). Each of the module substrates 30 includes a base surface 31 and an alignment key 33 that has a second profile 35 formed on a second crystalline plane (not shown) of the base surface 31. The second profile 35 complements the first profile 25 and the first crystalline plane of the mounting surface 21 is identical to the second crystalline plane of the base surface 31.

Figure 2:
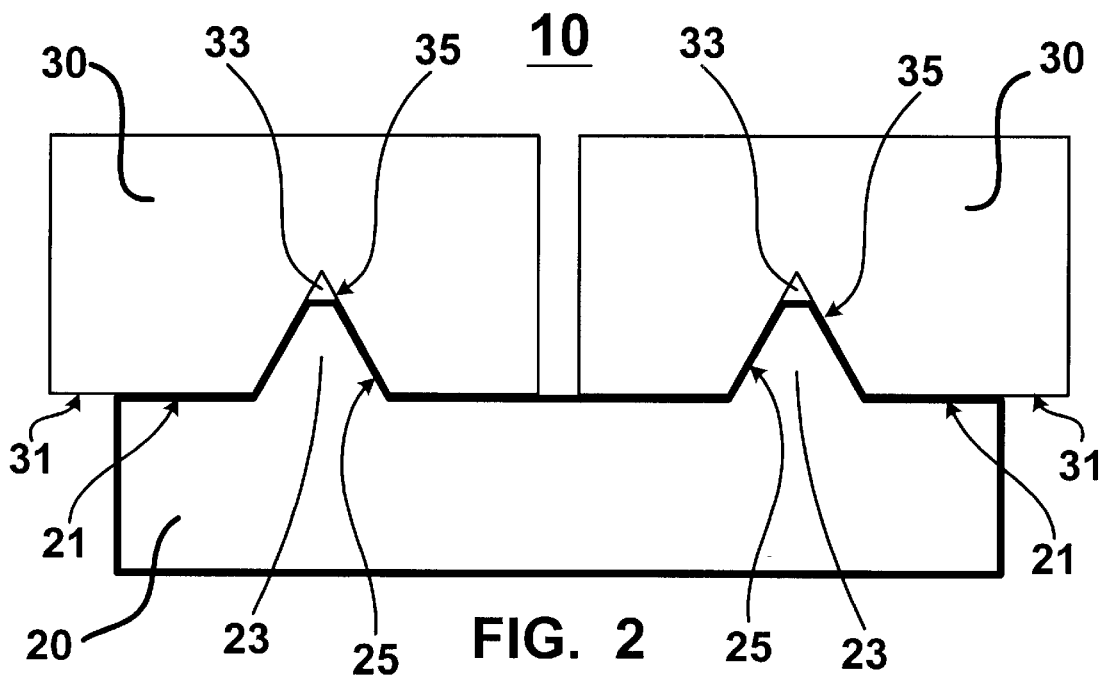
FIG. 2 is a cross-sectional view of the self-alignment features and the alignment keys of FIG. 1 connected in mating engagement according to the present invention.

Reference is now made to FIG. 2 in which the module substrates 30 are connected with the alignment substrate 20 by inserting (see dashed arrows I) their respective alignment keys 33 into a selected one of the self-alignment features 23 so that the alignment keys 33 and the self-alignment features 23 are connected in mating engagement with each other and the module substrates 30 are positioned in near perfect self-alignment with one another with substantially no skew. Once the module substrates 30 are connected with the alignment substrate 20, at least a portion of the second profile 35 of the alignment keys 33 are in contact with at least a portion of the first profile 25 of the self-alignment features 23.

Figure 3:
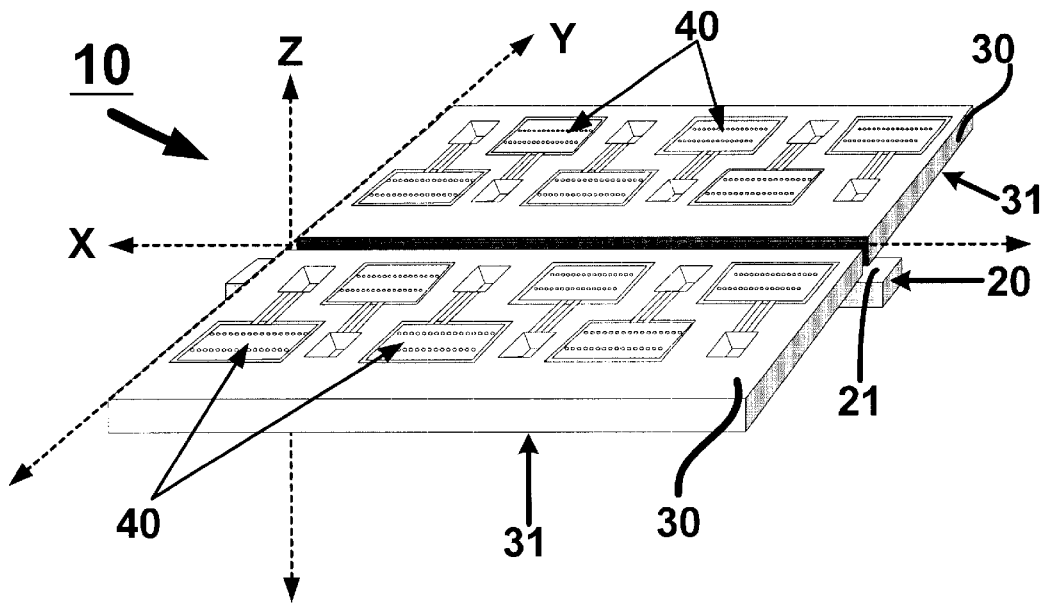
FIG. 3 is a plan view of module substrates mounted to a single alignment substrate according to the present invention.
Figure 4:
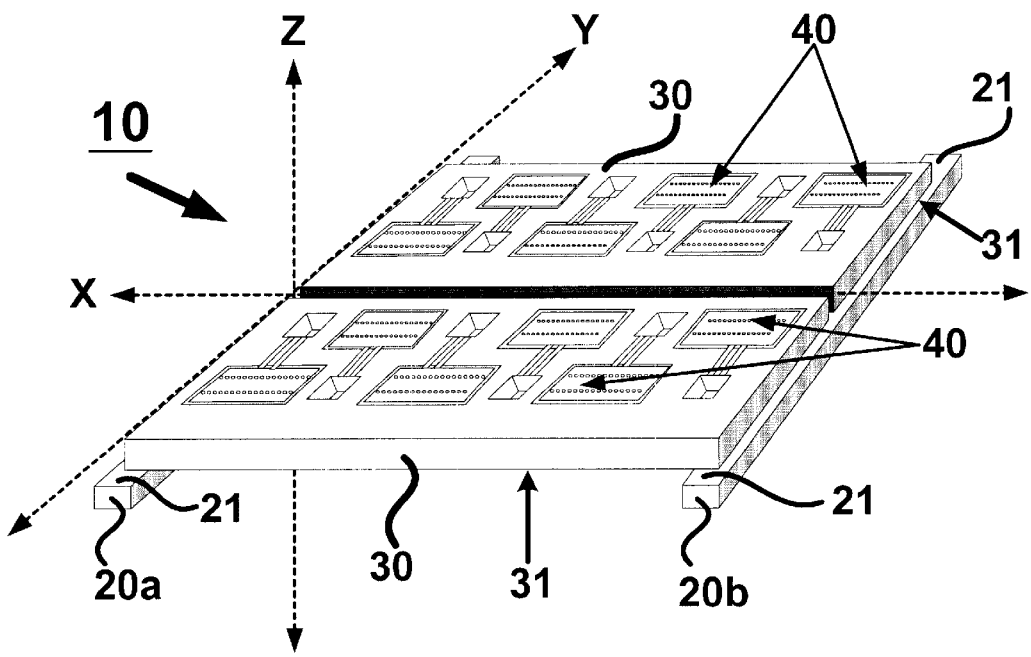
FIG. 4 is a plan view of module substrates mounted to a pair of alignment substrate according to the present invention.

In FIGS. 3 and 4, the system 10 can include one or more alignment substrates 20 upon which are mounted the module substrates 30. In FIG. 3, the module substrates 30 are connected with a single alignment substrate 20. On the other hand, in FIG. 4, the module substrates 30 are connected with a pair of alignment substrates denoted as 20a and 20b. The module substrates 30 are connected with the alignment substrate(s) 20 and are positioned in near perfect self-alignment with one another with substantially no skew in a X-Y plane (X, Y), a X-Z plane (X, Z), and a Y-Z plane (Y, Z) as shown by the X, Y, and Z axes in FIGS. 3 and 4. Although a Cartesian coordinate system is illustrated in FIGS. 3 and 4, the principles of the present invention are applicable to a coordinate system other than the Cartesian coordinate system.

The module substrates 30 can include one or more components that are connected with the module substrates 30. The types of components that can be connected with the module substrates 30 include but are not limited to an inkjet printhead, a thermal inkjet printhead, an ASIC, an IC, a semiconductor, a MicroElectroMechanical System (MEMS), a biological device, a biochemical device, an image sensing device, a light sensing device, and a fluidic device. If the module substrates 30 are made from a semiconductor material, as will be discussed below, an ideal candidate for the component to be carried by the module substrates 30 is another device made from a similar or identical semiconductor material, particularly if the material for the component has a coefficients of thermal expansion that is identical to that of the module substrates 30.

In color printing applications that use page wide print heads, the system 10 of the present invention can used to align multiple printbars in near perfect self-alignment with one another. Accordingly, the module substrates 30 can be printbars. In a typical color printing application there will be three or more print bars with each printbar printing a different color of ink. For instance, if the printer prints color using four colors of ink (Black, C, M, Y), then there will be four printbars, one for each of the four colors. For high image resolution and consistent image quality it is critical that the printbars be in near perfect self-alignment with one another. That goal can be accomplished using the system 10 of the present invention.

In one embodiment of the present invention, the alignment substrate 20 and the module substrates 30 are made from a single crystal material. The single crystal material has the advantage of being amendable to chemical machining (etching) along know crystalline planes of the single crystal material. Therefore, the first and second profiles (25, 35) can be formed by etching the mounting surface 21 and the base surface 31 along an identical crystalline plane. Preferably, the etching process is an anisotropic etch process that is adapted to successively dilute layers of the single crystal material. The etch rate of the single crystal material will depend to a large extent on which crystalline planes are exposed to the etchant. For instance, a gallium arsenide (GaAs) substrate will etch faster along the (111) arsenic (As) crystalline plane of the substrate than any other crystalline plane. Anisotropic differential rate wet etching processes and materials are well known in the art. The anisotropic etch process used will depend on the type of single crystal material and on the type of etchant used.

In one embodiment of the present invention, the single crystal material is a semiconductor material. Preferably, the semiconductor material comprises single crystal silicon (Si). As will be discussed below, the first and second profiles (25, 35) can be formed by etching the mounting surface 21 and the base surface 31 along identical crystalline planes of the single crystal silicon (Si). An anisotropic etch process can be used to form the first and second profiles (25, 35).

For instance, some etchants are more suitable for etching silicon (Si) and other etchants are more suitable for etching gallium arsenide (GaAs). Accordingly, in one embodiment of the present invention, the single crystal material is a semiconductor material. In yet another embodiment of the present invention, the semiconductor material is single crystal silicon (Si). The first and second profiles (25, 35) can be formed by etching the mounting surface 21 and the base surface 31 along identical crystalline planes of the single crystal silicon (Si).

Preferably, for single crystal silicon (Si), the mounting surface 21 and the base surface 31 have a 100 crystalline orientation. The single crystal silicon (Si) can be a (100) silicon (Si) substrate obtained by cutting a length-wise (100) Si substrate from a 110 Si ingot. Additionally, a large (100) Si wafer can be used as the starting material for the alignment substrate 20 and the module substrates 30. The first profile 25 is formed by etching the mounting surface 21 along a 111 crystalline plane. Similarly, the second profile 35 is formed by etching the base surface 31 along a 111 crystalline plane. As was mentioned above, an anisotropic etch process (wet etch) can be used to form the first and second profiles (25, 35).

Suitable materials for the anisotropic etch process include tetramethyl ammonium hydroxide (TMAH) and potassium hydroxide (KOH). Hydrogen bubbles in the TMAH can result in the formation of pyramids (hillcocks) on the first and second profiles (25, 35). The hydrogen bubbles cling to the surface of the Si and mask the surface beneath the bubbles from the etchant. The hillcocks can be removed by using a higher concentration of TMAH, preferably from about 5 weight percent to about 7 weight percent. The formation of the hillcocks can be completely eliminated by adding from about 5 grams per liter to about 10 grams per liter of either potassium (K) or ammonium peroxydisulfate to the TMAH.

Typically, the Si ingot is formed by touching a single crystal Si seed, in this case a 110 seed, to a melt surface and then slowly pulling the seed upward to grow the 110 Si ingot from the melt. The resulting 110 Si ingot can then be cut into thin slices by a diamond saw to form a raw (100) Si substrate. The surfaces of the raw (100) Si substrate are then lapped, etched, and heat treated, followed by polishing, cleaning and inspection. Resulting is a finished (100) Si substrate. The finished (100) Si substrate can be of differing grades of quality. For microelectronics applications, the finished (100) Si substrate is referred to as a "Prime Wafer". However, for the alignment substrate 20 of the present invention, a lower grade "Test Wafer" or 'Monitor Wafer" (100) Si substrate can be used. The shape of the (100) Si substrate need not be in the shape of a typical semiconductor wafer (i.e. substantially round). For instance, the shape of the (100) Si substrate can be rectangular.

The grade of the finished (100) Si substrate selected for the module substrates 30 will be application specific. For instance, if the module substrates 30 are thermal inkjet printheads, then the "Prime Wafer" grade can be selected for the module substrates 30. On the other hand, for applications that do not require microelectronic fabrication, a lower grade such as the "Test Wafer" or 'Monitor Wafer" grade can be selected for the module substrates 30. The size (length and width) of the (100) Si substrate will depend on the size of the 110 Si ingot. For instance, the (100) Si substrate can be from 8 inches long to over 72 inches long. Longer lengths for the (100) Si substrate may require the substrate be made thicker to mechanically support itself. Although the above discussion has focused on a (100) Si substrate, the present invention is not to be construed as being limited to the (100) Si substrate.

A general discussion of semiconductor crystalline structure and selective etch materials to preferentially etch exposed crystalline planes can be found in "VLSI fabrication principles: silicon and gallium arsenide", Sorab K. Ghandhi, 1983, John Wiley & Sons, pp 3–12, and pp 476–492.

One advantage to selecting single crystal silicon (Si) or some other semiconductor material for both the alignment substrate 20 and the module substrates 30 is that both the alignment substrate 20 and the module substrates 30 will have identical coefficients of thermal expansion so that the near perfect self-alignment between the module substrates is not compromised by environmental conditions including temperature variations. Therefore, misalignment between the module substrates 30 that could be caused by thermal stress, thermal mismatch, and dissimilar coefficients of thermal expansion is significantly reduced or is eliminated by using materials having identical coefficients of thermal expansion.

Figure 7:
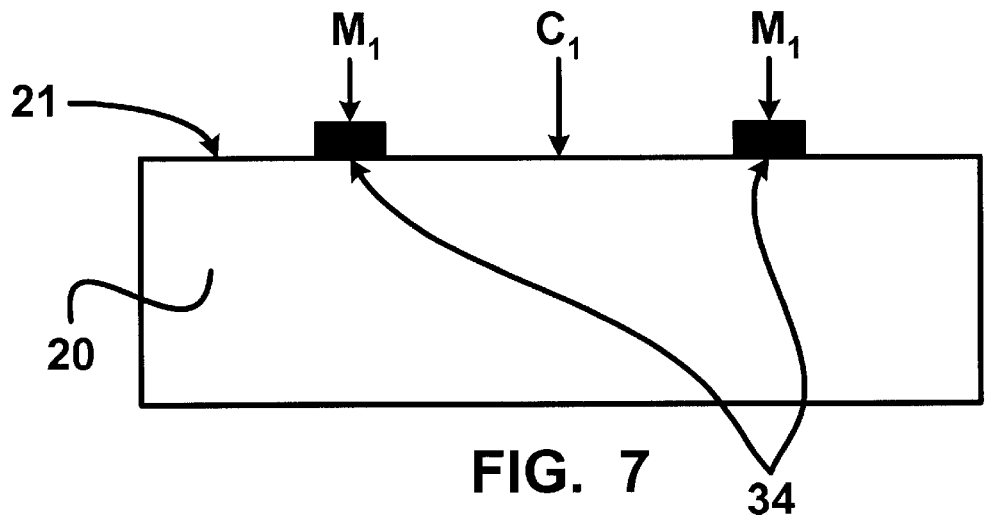
FIGS. 7 and 8 are cross-sectional views of patterning and then etching an alignment substrate to form mesa self-alignment features according to the present invention.
Figure 8:
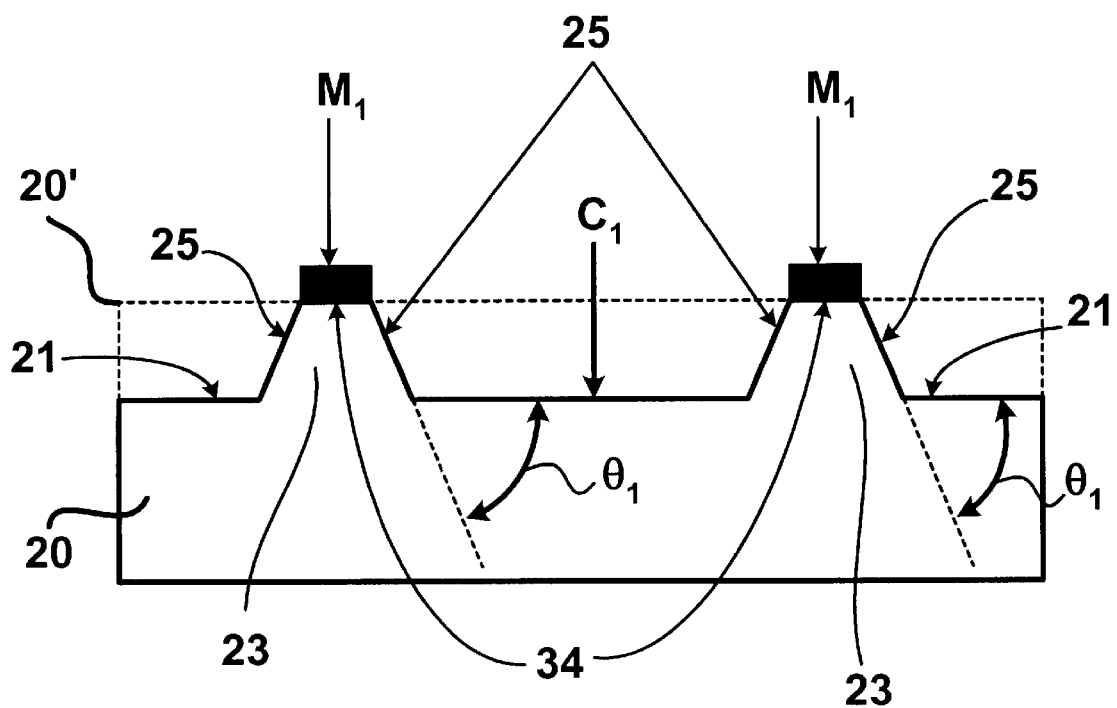

Reference is now made to FIGS. 7 and 8, in which patterning and etching of the alignment substrate 20 to form the self-alignment features 23 is illustrated. As was stated above, photolithography and etching processes that are well known to those skilled in the semiconductor and microelectronics arts can be used to form the self-alignment features 23 and the alignment keys 33 of the present invention. Accordingly, in FIG. 7, the alignment substrate 20 has a mask $M_1$ formed on the mounting surface 21 by a photolithographic process. The mask $M_1$ can be an etch resistant material such as silicon dioxide ($SiO_2$), silicon nitride ($SiN_3$), or photoresist for example. The alignment substrate 20 is a (100) silicon (Si) substrate and the mounting surface 21 has a (100) crystalline orientation $C_1$.

In FIG. 8, an anisotropic etchant is applied to those portions of the mounting surface 21 that are not covered by the mask $M_1$. The uncovered portions are dissolved to form the self-alignment features 23. The etchant dissolves the mounting surface 21 along a (111) crystalline plane to form the first profile 25 of the self-alignment features 23. The first profile 25 intersects the mounting surface 21 at an angle $\theta_1$ of about 54.74 degrees. Due to the action of the etchant, the mounting surface 21 has receded because material has been removed from the alignment substrate 20 as shown by dashed line 20'. The resulting first profile 25 of the self-alignment features 23 have a mesa shape that extends outward of the mounting surface 21. The portion of the mounting surface 21 that was covered by the mask $M_1$ forms a plateau 34 on the self-alignment features 23.

Figure 9:
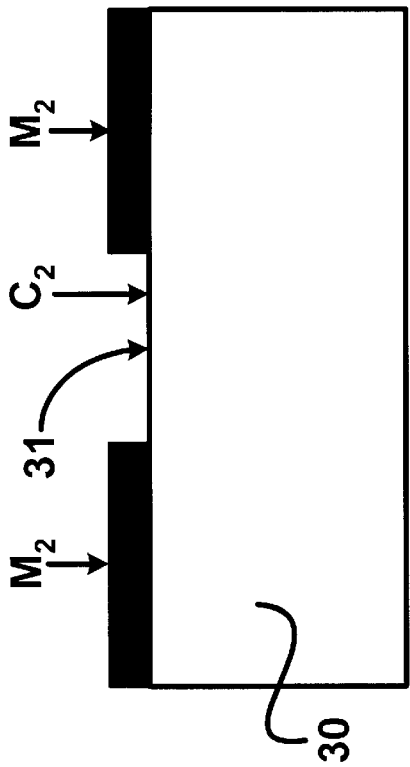
FIGS. 9 and 10 are cross-sectional views of patterning and then etching module substrates to form self-terminating pit alignment keys according to the present invention.
Figure 9:
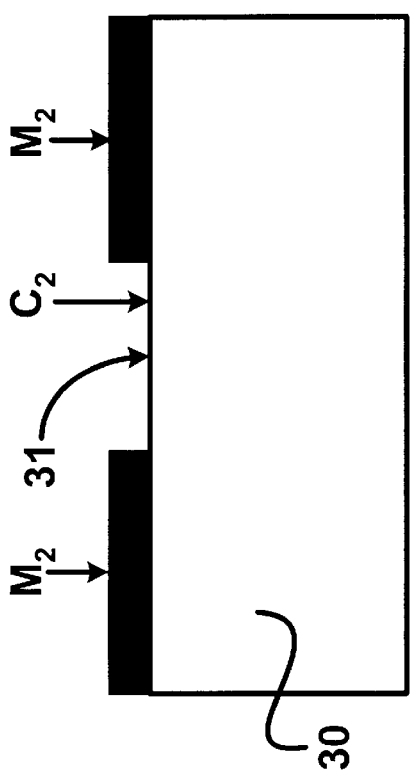
Figure 10:
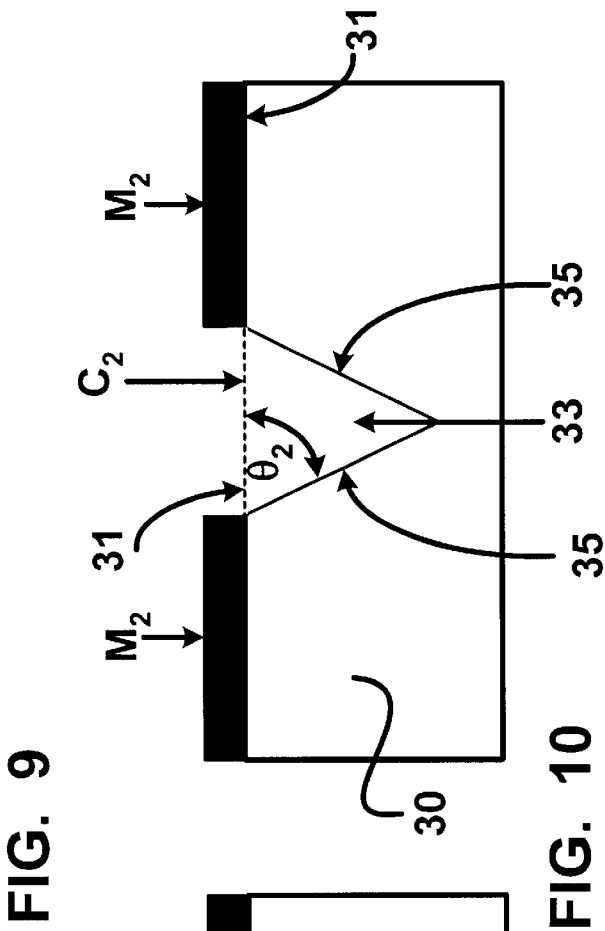

Reference is now made to FIGS. 9 and 10, in which the patterning and etching process described above in reference to FIGS. 7 and 8 is applied to the module substrates 30 to form the alignment keys 33. The module substrates 30 are a (100) silicon (Si) substrate and the base surfaces 31 have a (100) crystalline orientation $C_2$. A mask $M_2$ is formed on a portion of the base surface 31 to expose an aperture that will be etched to form the alignment keys 33. The etchant dissolves the base surface 31 along a (111) crystalline plane to form the second profile 35 of the alignment keys 33. The second profile 35 intersects the base surface 31 at an angle $\theta_2$ of about 54.74 degrees (the dashed line represents the etched away portion of the base surface 31). The resulting second profile 35 of the alignment keys 33 has a self-terminating pit shape that extends inward of the base surface 31 (shown in FIG. 10 as a dashed line). FIGS. 1 and 2 illustrate the above configurations for the mesa shape of the first profile 25 and the self-terminating pit shape for the second profile 35.

Because the first and second profiles (25, 35) are etched along an identical (111) crystalline plane and intersect their respective mounting and base surfaces (21, 31) at an angle of about 54.74 degrees, the mesa shape of the first profile 25 and the self-terminating pit shape of the second profile 35 compliment each other. It will be understood by one skilled in the semiconductor and microelectronics arts that the mask structure (mask $M_2$) of FIGS. 9 and 10 can be applied to the alignment substrate 20 to form the first profile 25 having the self-terminating pit shape for the self-alignment features 23. Conversely, the mask structure (mask $M_1$) of FIGS. 7 and 8 can be applied to the module substrates 30 to form the second profile 35 having the mesa shape for the alignment keys 33.

Figure 5:
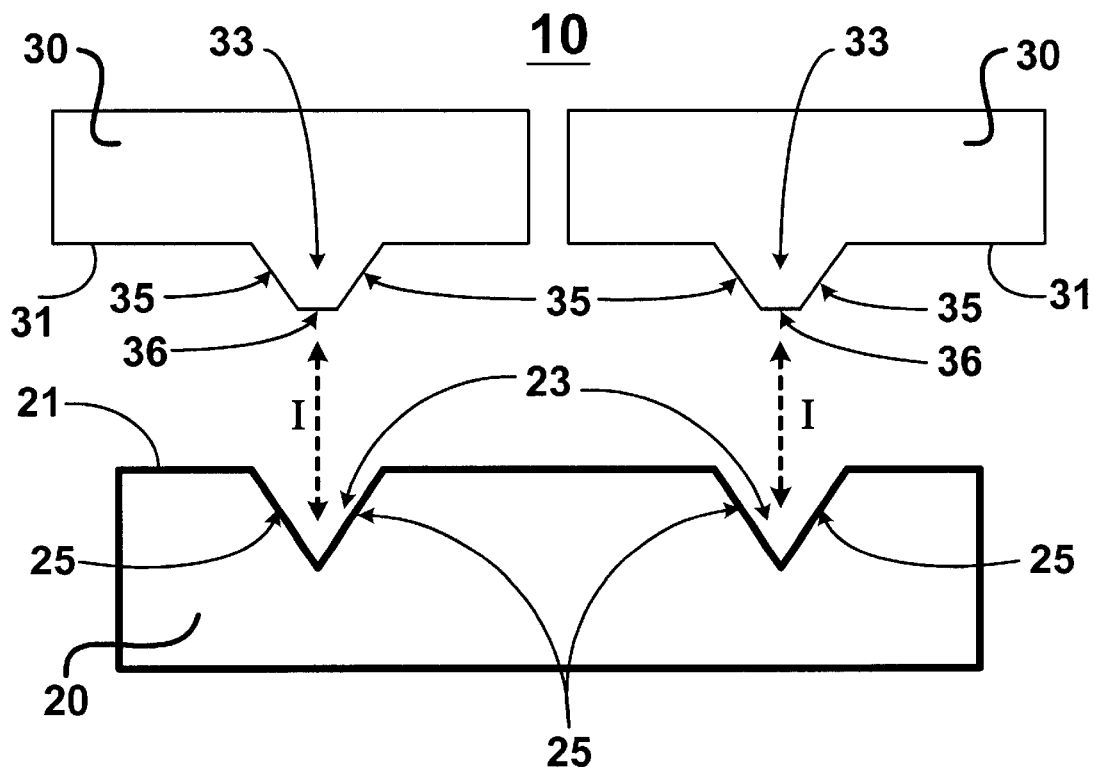
FIG. 5 is a cross-sectional view of an alignment substrate with self-terminating pit self-alignment features and module substrates with mesa alignment keys prior to being connected according to the present invention.
Figure 6:
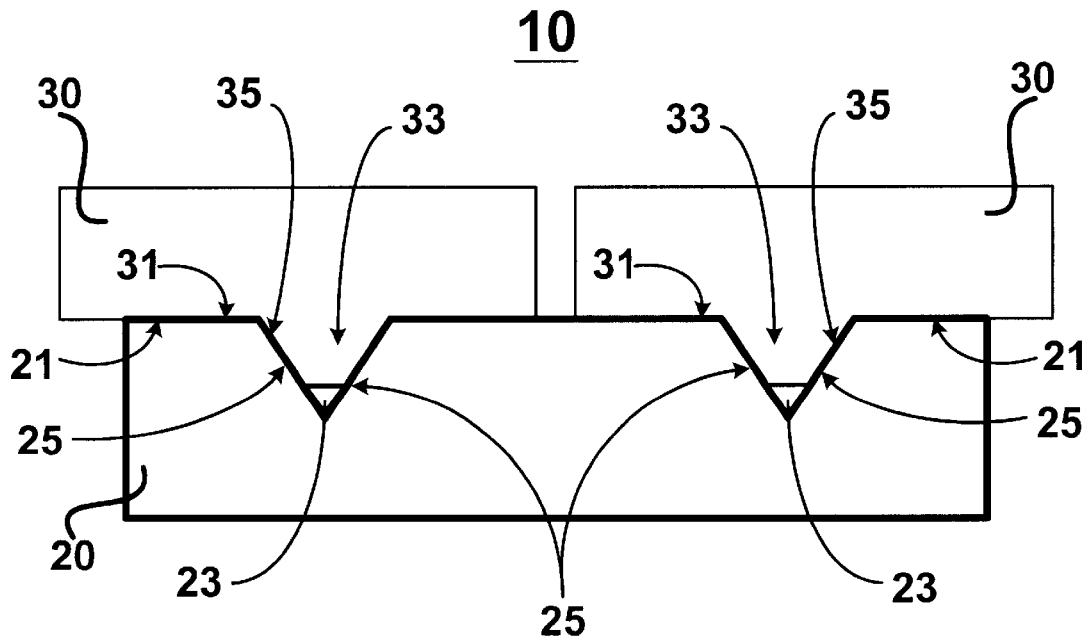
FIG. 6 is a cross-sectional view of the self-alignment features and the alignment keys of FIG. 5 connected in mating engagement according to the present invention.

In FIGS. 5 and 6, the module substrates 30, have alignment keys 33 with the second profile 35 having the mesa shape that extends outward of the base surface 31. The mesa shape terminates in a plateau 36. Similarly, the alignment substrate 20 has self-alignment features 23 with a first profile 25 having the self-termination pit shape the extends inward of the mounting surface 21.

Figure 11:
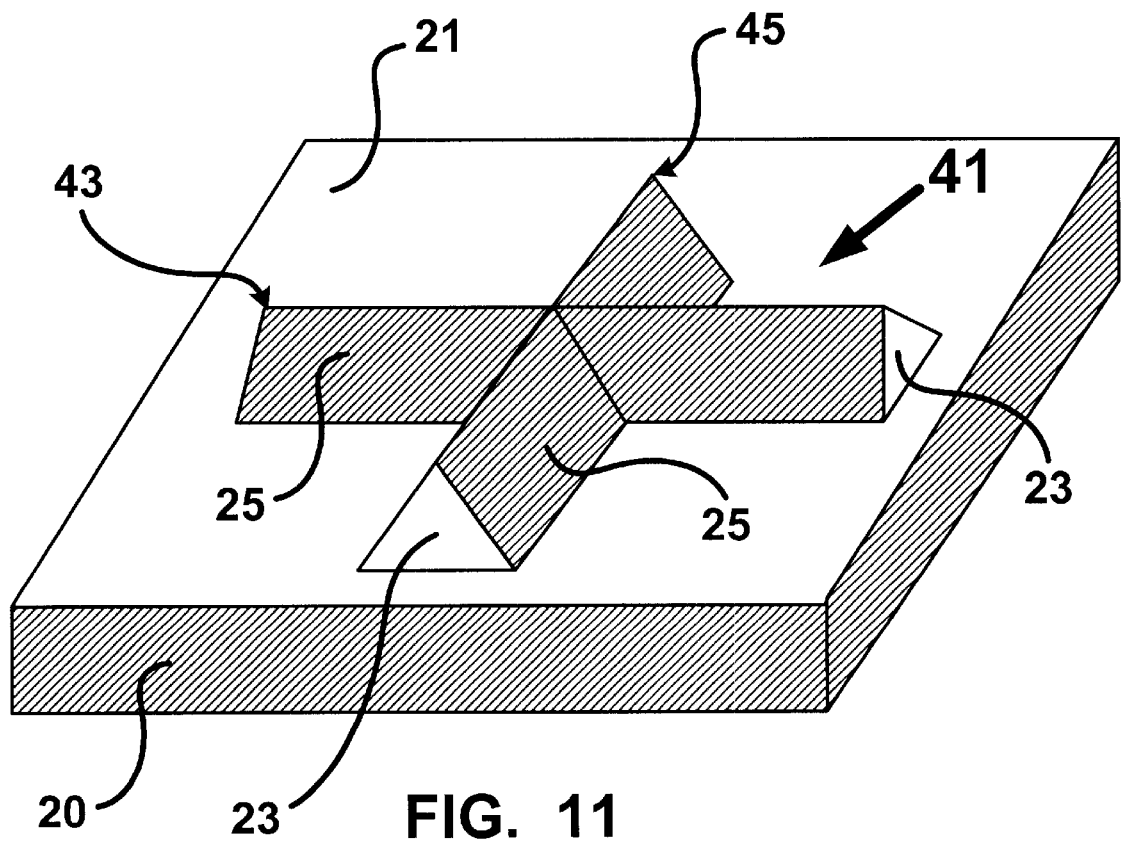
FIGS. 11 and 12 are plan views of an alignment substrate with a cross mesa and a module substrate with a cross self-terminating pit according to the present invention.
Figure 12:
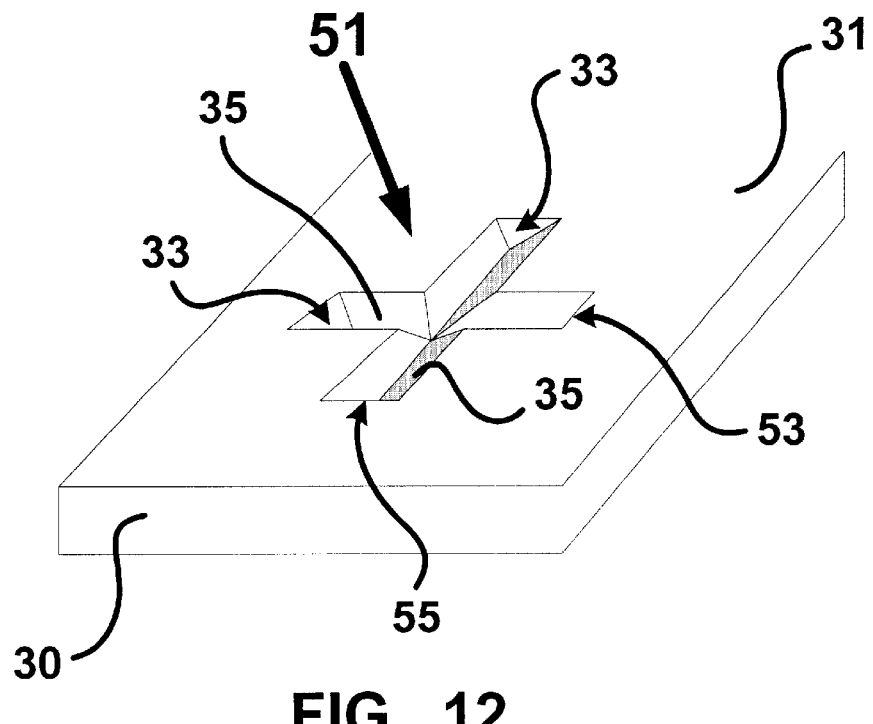

In one embodiment of the present invention, as illustrated in FIGS. 11 and 12, the first profile 25 includes a cross mesa 41 that extends outward of the mounting surface 21. The cross mesa 41 includes at least two intersecting segments (43 and 45). The second profile 35 includes a self-terminating cross 51 that extends inward of the base surface 31. The self-terminating cross 51 includes at least two intersecting segments (53 and 55). The first and second profiles (25, 35) of the cross mesa 41 and the self-terminating cross 51 compliment each other. Although not illustrated in FIGS. 11 and 12, the first profile 25 can include a self-terminating cross that extends inward of the mounting surface 21 and the second profile 35 can include a cross mesa that extends outward of the base surface 31.

Figure 13:
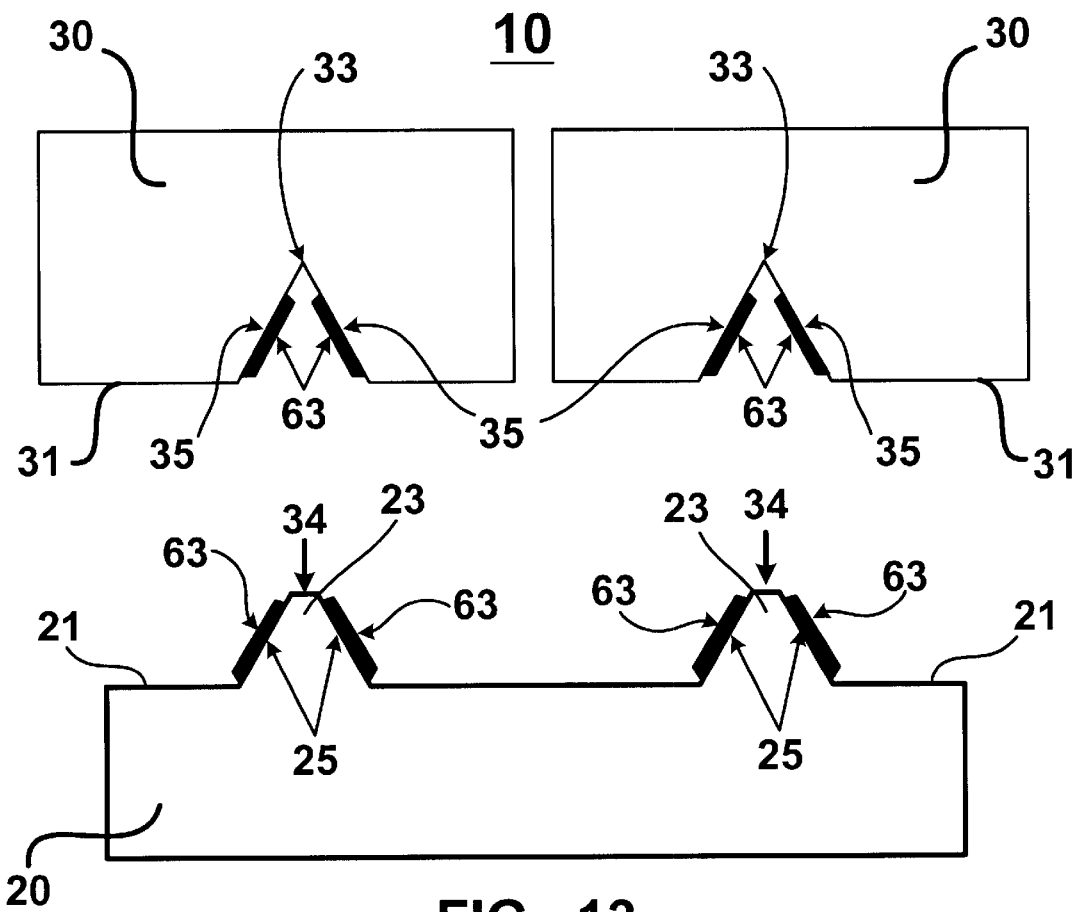
FIGS. 13 and 14 are cross-sectional views of an alignment substrate and module substrates with an adhesive applied to the self-alignment features and the alignment keys according to the present invention.
Figure 14:
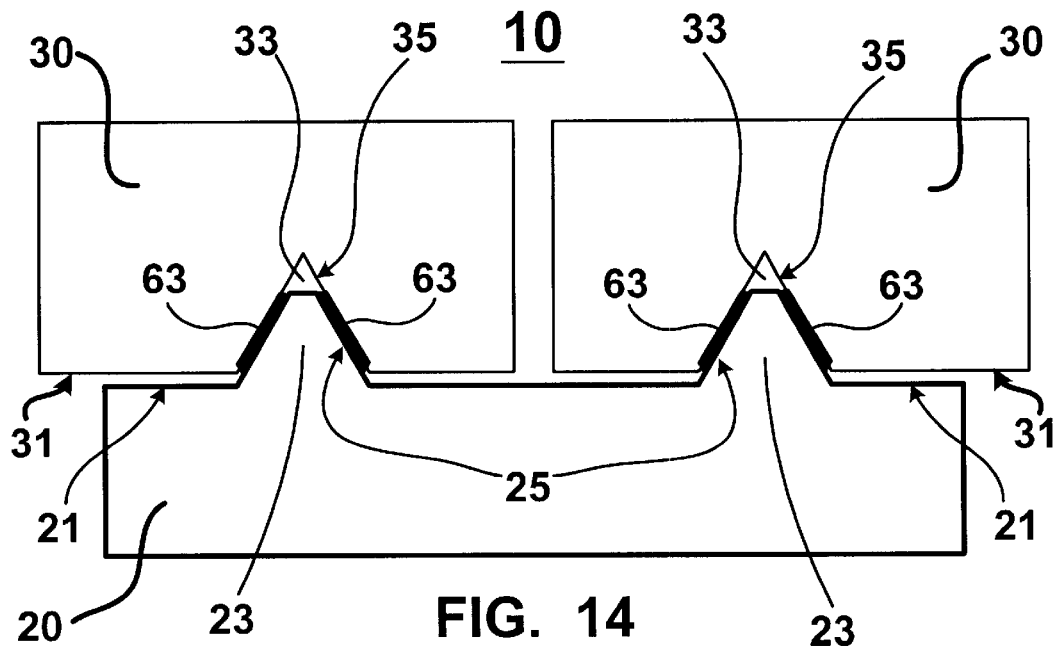

In yet another embodiment of the present invention, as illustrated in FIGS. 13 and 14, either one or both of the first profile 25 and second profile 35 can include an adhesive 63 deposited thereon to fixedly connect (see FIG. 14) the module substrates 30 with the alignment substrate 20. The adhesive 63 can be a low viscosity adhesive that lubricates the first and second profiles (25, 35) to effectuate mating of the first and second profiles (25, 35) by reducing friction between the first and second profiles (25, 35).

In one embodiment of the present invention, either one of the alignment substrate 20 and the module substrates 30 are oxidized to form a silicon oxide ($SiO_2$) layer thereon and the first and second profiles (25, 35) are atomically flat along a portion of their respective (111) crystalline planes. The module substrates 30 are mounted to the alignment substrate 20 by an anodic bond between the first and second profiles (25, 35). The first and second profiles (25, 35) can be formed by an anisotropic etch process as described above.

Figure 15:
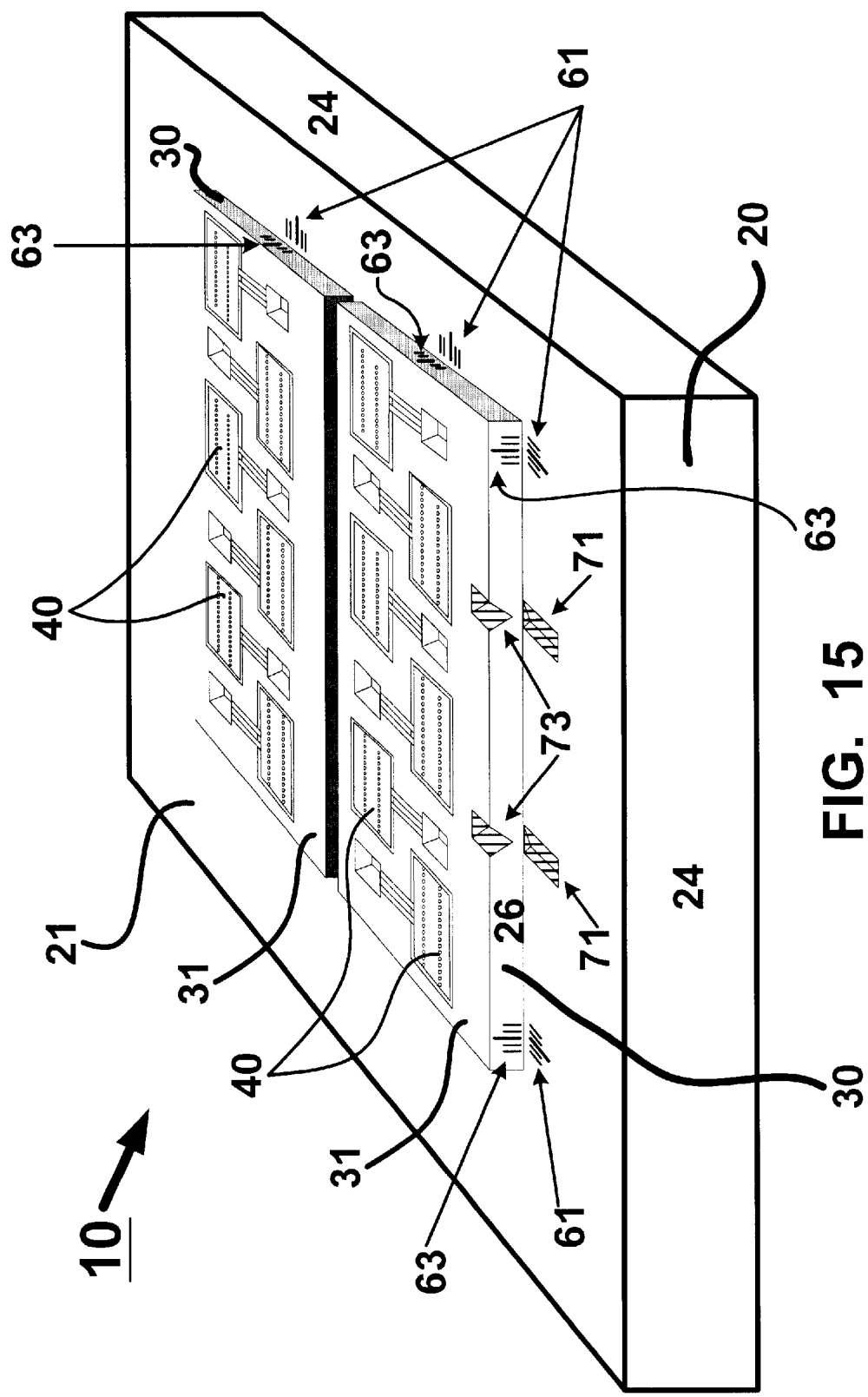
FIG. 15 is a plan view of an alignment substrate with alignment targets thereon and module substrates with alignment markers thereon according to the present invention.

Reference is now made to FIG. 15, in which two module substrates 30 are connected with an alignment substrate 20. The alignment substrate 20 includes at least one alignment target (61, 71) formed at a predetermined location. The predetermined location can be on the mounting surface 21 (as shown in FIG. 15) or on a side portion 24, for example. Similarly, the module substrates 30 include at least one alignment marker (63, 73) formed at a predetermined location on each module substrate 30. The predetermined location can be on the base surface 31 (as shown in FIG. 15) or on a side portion 26, for example. The modules substrates 30 are connected with the alignment substrate 20 by aligning their respective alignment markers (63, 73) with a preselected one or more of the alignment targets (61, 71) so that the alignment keys 33 (not shown) of the modules substrates 30 are oriented to align with and to mate with their corresponding self-alignment features 23 (not shown) on the alignment substrate 20. The alignment targets and the alignment markers can be pits that are etched in the alignment substrate 20 and the modules substrates 30 at their respective predetermined locations as illustrated by the pits 71 on the alignment substrate 20 and the pits 73 on the modules substrates 30. On the other hand, the alignment targets and the alignment markers can be incised marks as illustrated by the incised marks 61 on the alignment substrate 20 and the incised marks 63 on the modules substrates 30. The incised marks (61, 63) can also be formed by an etch process.

The alignment targets (61, 71) and the alignment markers (63, 73) can be used to aid in the alignment of the alignment keys 33 with their corresponding self-alignment features 23, particularly when those features are concealed from view during the mounting process or when the feature sizes are so small that it is difficult or impossible to view them with an unaided eye. The alignment can be accomplished manually or using automated means including machine vision and pattern recognition to precisely align the alignment targets (61, 71) and the alignment markers (63, 73) with one another. For manual alignment, it may be necessary to use a magnifying device such as a boroscope or a microscope in order to see the alignment targets (61, 71) and the alignment markers (63, 73).

Figure 16:
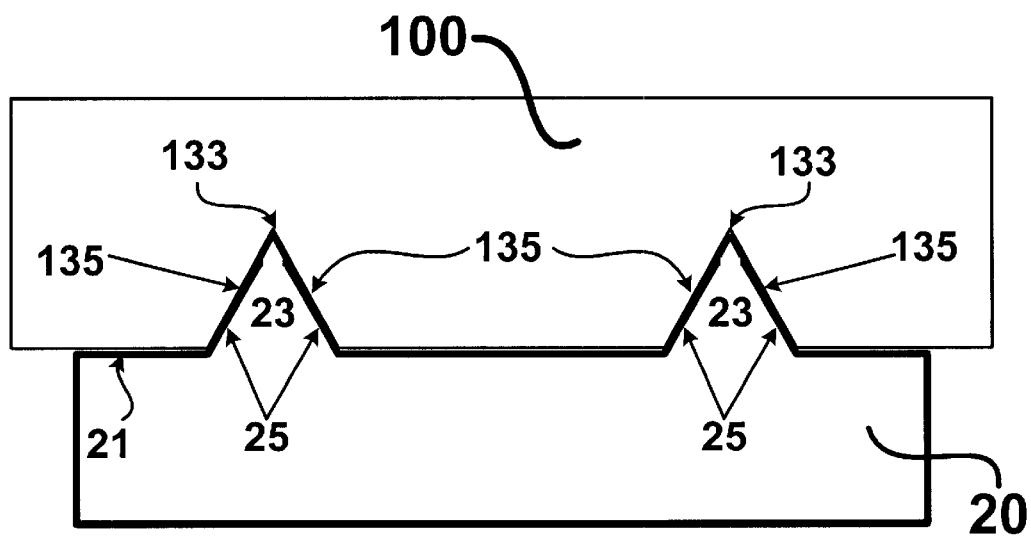
FIG. 16 is a cross-sectional view of an alignment substrate formed using a template according to the present invention.
Figure 17:
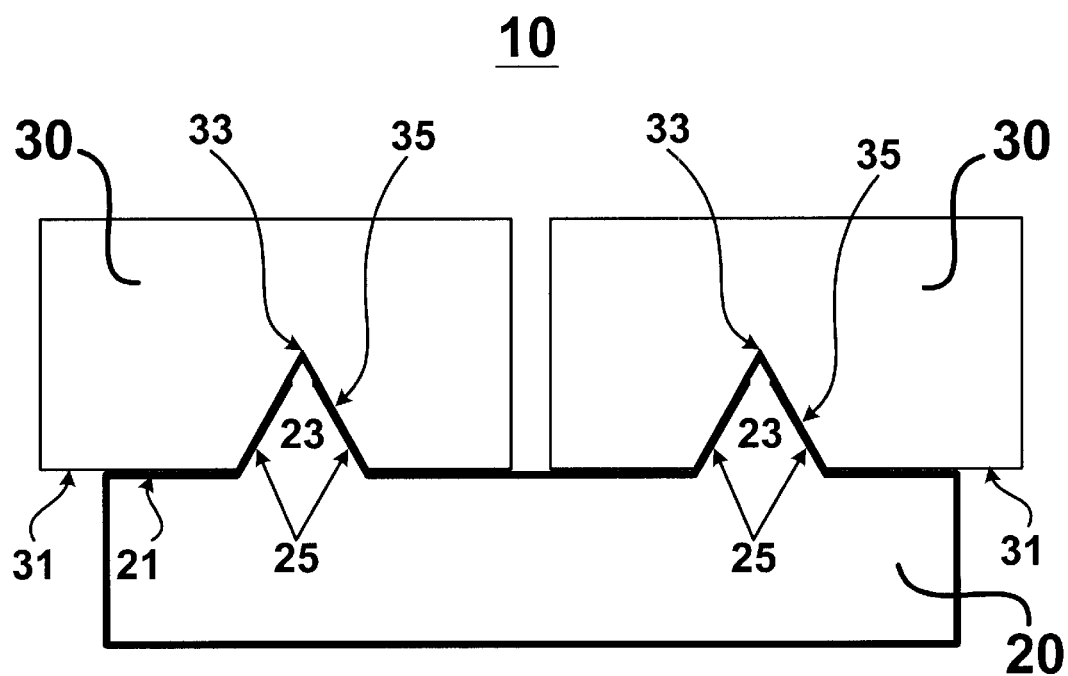
FIG. 17 is a cross-sectional view of the alignment substrate of FIG. 16 connected with module substrates according to the present invention.

In one embodiment of the present invention, as illustrated in FIGS. 16 and 17, a template 100 is used to form the self-alignment features 23 of the alignment substrate 20. The module substrates 30 of FIG. 17 are made using the processes and materials discussed above; however, the alignment substrate 20 is manufactured from the template 100. The template 100 includes a plurality of template features 133 that include a profile 135 that is identical to the second profile 35 of the alignment keys 33 of the module substrate 30 (see FIG. 17). The alignment substrate 20 includes the mounting surface 21 and a plurality of self-alignment features 23 having the first profile 25. In contrast to the above embodiments in which the alignment substrate 20 comprised a substrate material such as single crystal silicon (Si), in the embodiment illustrated in FIG. 16 the alignment substrate 20 is made from a material that includes but is not limited to INCONEL™, INVAR™, KOVAR™, MONEL™, a nickel alloy, copper, and a nickel-copper alloy. The first profile 25 of the self-alignment features 23 is formed by applying a material to the template 100 such that the material conforms to the profile 135 so that the resulting first profile 25 compliments the second profile 35. Subsequently, the alignment substrate 20 can be removed from the template 100 by peeling it off, for example, and then the module substrates 30 can be connected with the alignment substrate 20 by inserting their respective alignment keys 33 into a selected one of the self-alignment features 23 as illustrated in FIG. 17. The alignment keys 33 and the self-alignment features 23 are connected in mating engagement with each other and the module substrates 30 are positioned in near perfect self-alignment with one another with substantially no skew. The module substrates 30 are connected with the alignment substrate 20 and are positioned in near perfect self-alignment with one another with substantially no skew in a X-Y plane (X, Y), a X-Z plane (X, Z), and a Y-Z plane (Y, Z) as shown by the X, Y, and Z axes as described in reference to FIGS. 3 and 4 above.

The first profile 25 of the self-alignment features 23 can be formed by precision machining processes that are well known in the semiconductor, microelectronics, and MEMS art. Suitable precision machining processes include but are not limited to plating, molding, electroforming, microelectroforming, micromolding, and electrodeposition.

Although several embodiments of the present invention have been disclosed and illustrated, the invention is not limited to the specific forms or arrangements of parts so described and illustrated. The invention is only limited by the claims.

What is claimed is:

1. A system for precision self-alignment of multiple modules, comprising:
   at least one alignment substrate including at least one mounting surface and a plurality of self-alignment features having a first profile formed along a first crystalline plane of the mounting surface; and
   a plurality of module substrates, each module substrate including a base surface and an alignment key having a second profile formed along a second crystalline plane of the base surface, the second profile complements the first profile and the first and second crystalline planes are identical to each other,
   the module substrates are connected with the alignment substrate by inserting their respective alignment keys into a selected one of the self-alignment features so that the alignment keys and the self-alignment features are connected in mating engagement with each other, and
   wherein the module substrates are positioned in near perfect self-alignment with one another with substantially no skew in a X-Y plane, a X-Z plane, and a Y-Z plane of a coordinate system.

2. The system as set forth in claim 1, wherein the coordinate system is a Cartesian coordinate system.

3. The system as set forth in claim 1, wherein the alignment and module substrates are made from a single crystal material and the first and second profiles are formed by etching the mounting and base surfaces along identical crystalline planes of the single crystal material.

4. The system as set forth in claim 3, wherein the first and second profiles are formed by an anisotropic etch process.

5. The system as set forth in claim 3, wherein the single crystal material is a semiconductor material.

6. The system as set forth in claim 3, wherein the semiconductor material comprises single crystal silicon and the first and second profiles are formed by etching the mounting and base surfaces along identical crystalline planes of the single crystal silicon.

7. The system as set forth in claim 6, wherein the mounting surface and the base surface have a 100 crystalline orientation, the first profile is formed by etching the mounting surface along a 111 crystalline plane, and the second profile is formed by etching the base surface of the module substrates along a 111 crystalline plane.

8. The system as set forth in claim 7, wherein the first and second profiles are formed by an anisotropic etch process.

9. The system as set forth in claim 7, wherein the 111 crystalline plane of the first profile intersects the mounting surface of the alignment substrate at an angle of about 54.74 degrees and the 111 crystalline plane of the second profile intersects the base surface of the module substrates at an angle of about 54.74 degrees.

10. The system as set forth in claim 7, wherein the first and second profiles are atomically flat along at least a portion of their respective 111 crystalline planes and the modules substrates are mounted to the alignment substrate by an anodic bond between the first and second profiles.

11. The system as set forth in claim 10, wherein the first and second profiles are formed by an anisotropic etch process.

12. The system as set forth in claim 1, wherein the first profile comprises a mesa extending outward of the mounting surface and the second profile comprises a self-terminating pit extending inward of the base surface of the module substrates.

13. The system as set forth in claim 1, wherein the first profile comprises a self-terminating pit extending inward of the mounting surface and the second profile comprises a mesa extending outward of the base surface of the module substrates.

14. The system as set forth in claim 1, wherein the first profile comprises a cross mesa extending outward of the mounting surface and including at least two intersecting segments and the second profile comprises a self-terminating cross extending inward of the base surface of the module substrates and including at least two intersecting segments.

15. The system as set forth in claim 1, wherein the first profile comprises a self-terminating cross extending inward of the mounting surface and including at least two intersecting segments and the second profile comprises a cross mesa extending outward of the base surface of the module substrates and including at least two intersecting segments.

16. The system as set forth in claim 1, wherein the module substrates can include one or more components selected from the group consisting of an inkjet printhead, a thermal inkjet printhead, an ASIC, an IC, a semiconductor, a MicroElectroMechanical System, a biological device, a biochemical device, an image sensing device, a light sensing device, and a fluidic device.

17. The system as set forth in claim 1 and further comprising:

at least one alignment target formed on the alignment substrate at a predetermined location thereon; and at least one alignment marker formed on each module substrate at a predetermined location on each module substrate, and wherein the modules substrates are connected with the alignment substrate by aligning their respective alignment markers with a pre-selected one or more of the alignment targets so that the alignment keys of the modules substrates are oriented to align with and to mate with their corresponding self-alignment features on the alignment substrate.

18. The system as set forth in claim 1, wherein the alignment substrate and the module substrates have identical coefficients of thermal expansion so that the near perfect self-alignment between the module substrates is not compromised by environmental conditions including temperature variations.

19. The system as set forth in claim 1, wherein either one or both of the first and second profiles includes an adhesive deposited thereon to fixedly connect the module substrates with the alignment substrate.

20. The system as set forth in claim 1, wherein each of the module substrates comprises a printbar.

* * * * *